(12) United States Patent
Chugg et al.

(10) Patent No.: US 8,261,153 B2
(45) Date of Patent: Sep. 4, 2012

(54) SYSTEMATIC WITH SERIAL CONCATENATED PARITY CODE WITH VARYING INNER OR OUTER CODES

(75) Inventors: Keith M. Chugg, La Canada, CA (US); Jordan Melzer, Edmonton (CA)

(73) Assignee: University of Southern California, Los Angeles, CA (US)

( * ) Notice: Subject to any disclaimer, the term of this patent is extended or adjusted under 35 U.S.C. 154(b) by 1355 days.

(21) Appl. No.: 11/875,810

(22) Filed: Oct. 19, 2007

(65) Prior Publication Data

US 2008/0098286 A1    Apr. 24, 2008

Related U.S. Application Data

(60) Provisional application No. 60/862,175, filed on Oct. 19, 2006.

(51) Int. Cl.
*H03M 13/00* (2006.01)
*H03M 13/03* (2006.01)

(52) U.S. Cl. .......................... 714/758; 714/755; 714/790

(58) Field of Classification Search .................. 714/758, 714/763; 341/50, 67
See application file for complete search history.

(56) References Cited

U.S. PATENT DOCUMENTS

2005/0216819 A1*  9/2005  Chugg et al. .................. 714/786
2006/0031737 A1*  2/2006  Chugg et al. .................. 714/755
2007/0011566 A1*  1/2007  Gray et al. .................... 714/758

OTHER PUBLICATIONS

U.S. Appl. No. 11/060,081, "Method and Apparatus for Communications Using Turbo Like Codes", filed Feb. 16, 2005.
U.S. Appl. No. 11/203,683, "Method and Apparatus for Communications Using Improved Turbo Like Codes", filed Aug. 12, 2005.

* cited by examiner

*Primary Examiner* — Ajay Bhatia
*Assistant Examiner* — Daniel McMahon
(74) *Attorney, Agent, or Firm* — Fish & Richardson P.C.

(57) ABSTRACT

Systems and techniques for transmitting an Irregular Systematic with Serially Concatenated Parity (Ir-S-SCP) are described. The techniques include generating an outer code comprising a plurality of bits using systematic bits as input, repeating the plurality of bits of the outer code a pre-determined number of times to generate at least a first set of repeated bits and a second set of repeated bits, serializing the generated sets of repeated bits, wherein each generated set is serialized in parallel with another generated set, interleaving the generated sets of repeated bits, generating an inner code, the inner code generated in part based on the interleaved sets, puncturing the inner code to output parity bits, wherein the puncturing is non-uniform and the puncturing is based at least in part on an incremental redundancy scheme, and transmitting the parity bits, wherein the transmitted parity bits and the systematic bits comprise the Ir-S-SCP code.

25 Claims, 9 Drawing Sheets

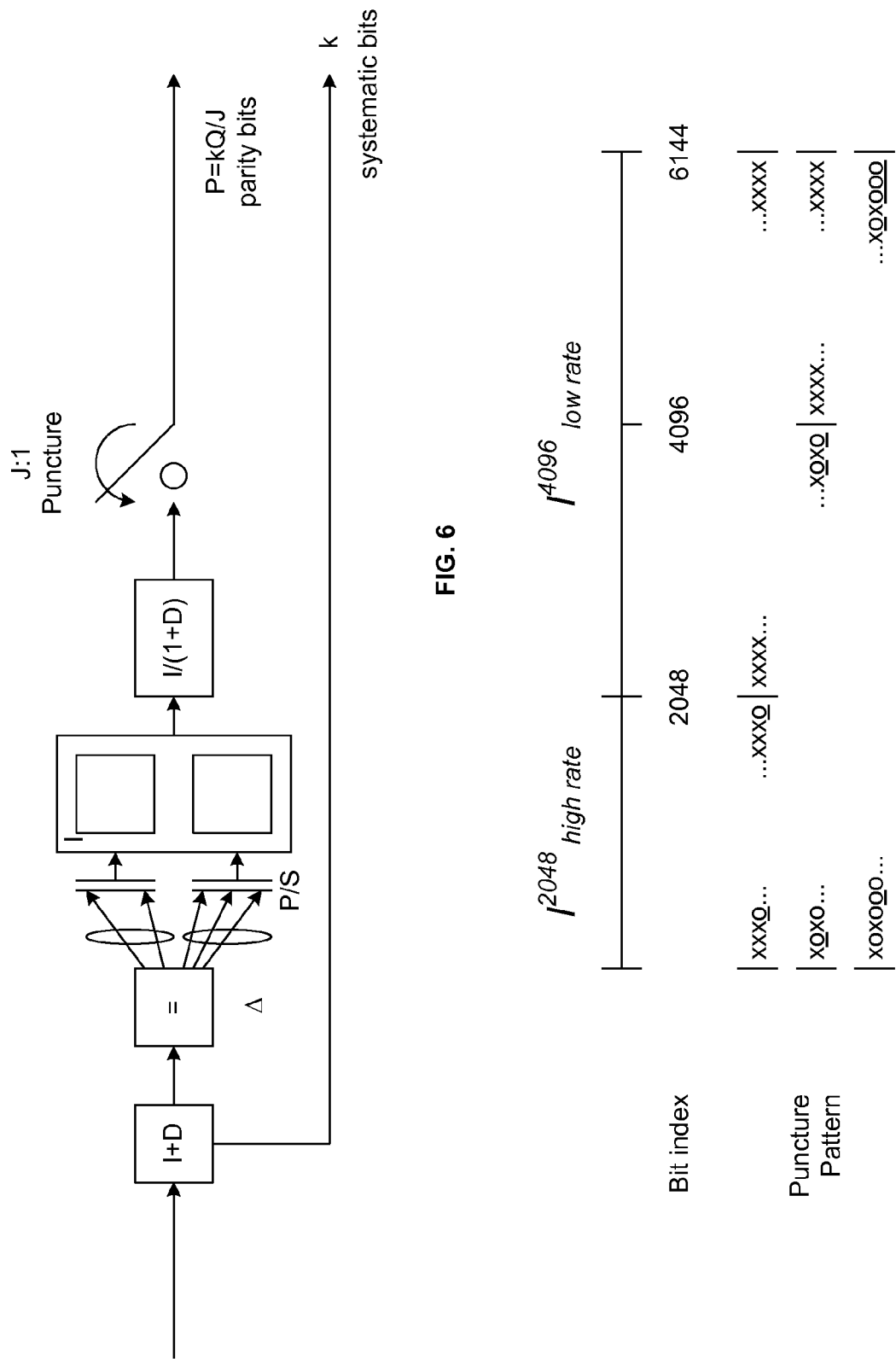

SYSTEMATIC WITH SERIAL CONCATENATED PARITY CODE WITH VARYING INNER OR OUTER CODES

CROSS-REFERENCE TO RELATED APPLICATIONS

This application claims the benefit of the filing date of U.S. Provisional Application Ser. No. 60/862,175, filed on Oct. 19, 2006, and entitled "Rate Compatible Turbo-like Codes with Incremental Complexity and Application to Progressive Transmission Systems," the entire disclosure of which is incorporated herein by reference.

STATEMENT REGARDING FEDERALLY SPONSORED RESEARCH

This invention was made with government support under Contract No. CCF0428940 awarded by the National Science Foundation. The government has certain rights in the invention.

TECHNICAL FIELD

This specification relates to signal encoding.

BACKGROUND

Low-density parity check (LDPC) codes are used in transmitting signals over noisy transmission channels. LDPC codes and other error correction codes decrease the probability that information transmitted over the noisy channel is lost. Repeat Accumulate and Irregular Repeat Accumulate (IRA) codes can be viewed either as structured LDPC codes or as concatenated codes. IRA codes perform as well as the best unstructured LDPC codes, reaching rates approaching capacity on the additive white Gaussian noise (AWGN) channel. Modern turbo-like codes (TLCs), including concatenated convolutional codes and LDPC codes, have been shown to approach the Shannon limit on the AWGN channel. Systematic with Serially Concatenated Parity (S-SCP) codes are a class of codes, where a single decoder can provide performance close to theoretical limits over a wide range of block sizes, code rates, and desired frame error rates.

SUMMARY

This specification describes technologies relating to irregular systematic with serially concatenated parity (S-SCP) codes.

In one aspect, a method for transmitting an irregular systematic with serially concatenated parity (Ir-S-SCP) code is described. The method includes generating an outer code including a plurality of bits using systematic bits as input, repeating the plurality of bits of the outer code a pre-determined number of times to generate at least a first set of repeated bits and a second set of repeated bits, serializing the generated sets of repeated bits wherein each generated set is serialized in parallel with another interleaved set, interleaving the generated sets of repeated bits, generating an inner code, the inner code generated in part based on the interleaved sets, puncturing the inner code to output parity bits, wherein the puncturing is non-uniform and the puncturing is based at least in part on an incremental redundancy scheme, and transmitting the parity bits, wherein the transmitted parity bits and the systematic bits comprise the Ir-S-SCP code.

This, and other aspects, can include one or more of the following features. Puncturing the inner code based at least in part on the incremental redundancy scheme can include selecting at least one of a repetition profile, a fraction of bits to puncture, and an average number of repetitions per outer code, wherein the repetition profile, the fraction of bits to puncture, and the average number of repetitions per outer code are optimized to be comparable to a performance of point design generated Ir-S-SCP code. The method can further include increasing the fraction of bits to puncture, wherein increasing the fraction of bits to puncture causes an average number of repetitions per outer code per output bit to decrease. The method can further include puncturing the inner code to remove one or more sections near an end of the inner code, wherein the puncturing decreases a length of the inner code. The inner code can be punctured based on a puncture pattern. A fraction of bits to puncture can be ⅕, a number of systematic bits can be 1024, the first repeated set can include 2048 bits, and the second repeated set can include 4096 bits. The Ir-S-SCP code can be an irregular repeat accumulate code. The outer code can be generated based on a generator function. The generator function can be a constant. The generator function can be (1+D). The generator function can include a constant and (1+D). The plurality of bits can be repeated twice.

In another aspect, a system for transmitting an Ir-S-SCP code is described. The system includes a generator to generate an outer code including a plurality of bits using systematic bits as input, a repetition unit to repeat the plurality of bits of the outer code a pre-determined number of times to generate at least a first set of repeated bits and a second set of repeated bits, a plurality of parallel to serial conversion unit to serialize generated sets of repeated bits, wherein each generated set of repeated bits is serialized in parallel with another generated set of repeated bits, an interleaver to interleave the generated sets, a code accumulator to generate an inner code, the inner code generated in part based on the interleaved sets, a puncturer to puncture the inner code to output parity bits, wherein the puncturing is non-uniform and the puncturing is based at least in part on an incremental redundancy scheme, and a transmitter to transmit the parity bits, wherein the transmitted parity bits and the systematic bits comprise the Ir-S-SCP code.

This, and other aspects, can include one or more of the following features. Puncturing the inner code based at least in part on the incremental redundancy scheme can include selecting at least one of a repetition profile, a fraction of bits to puncture, and an average number of repetitions per outer code, wherein the repetition profile, the fraction of bits to puncture, and the average number of repetitions per outer code are optimized to be comparable to a performance of point design generated Ir-S-SCP code. The method can further include increasing the fraction of bits to puncture, wherein increasing the fraction of bits to puncture causes an average number of repetitions per outer code output bit to decrease. The method can further include puncturing the inner code to remove one or more sections near an end of the inner code, wherein the puncturing decreases a length of the inner code. The inner code can be punctured based on a puncture pattern. A fraction of bits to puncture can be ⅕, a number of systematic bits can be 1024, the first repeated set can include 2048 bits, and the second repeated set can include 4096 bits. The Ir-S-SCP code can be an irregular repeat accumulate code. The outer code can be generated based on a generator function. The generator function can be a constant. The generator function can be (1+D). The generator function can include a constant and (1+D). The plurality of bits can be repeated twice. The system can further include a receiver to receive the transmitted Ir-S-SCP code. The system can further include a decoder to decode the Ir-S-SCP code.

Particular implementations of the subject matter described in this specification can be implemented to realize one or more of the following advantages. Irregular Systematic with Serially Concatenated Parity (Ir-S-SCP) codes can be designed to achieve the performance of Irregular Repeat Accumulate (IRA) codes, comparable to the performance of point design-generated codes. The Ir-S-SCP codes can be designed for both near-capacity and more practical lower-complexity designs. Ir-S-SCP codes can lower the $E_b/N_o$ threshold, namely, the lowest $E_b/N_o$ that will give perfect error correction in the limit of infinite block size and an infinite number of iterations. The Ir-S-SCP codes can be extended to low rates and offer a mix of low-complexity and high performance. Further, the Ir-S-SCP codes can exhibit performance versus complexity tradeoffs very close to those of Ir-S-SCP point designs. In addition, the designs described achieve rate compatible puncturing that is suitable for an incremental redundancy scheme. The Ir-S-SCP codes also exhibit reduction in memory requirements relative to IRA codes because of their smaller interleavers. At each rate in the scheme, there is flexibility in the per-iteration complexity that allows a near-optimal trade-off between complexity and performance. Because the Ir-S-SCPs can be designed to offer rate compatible puncturing capability, a single decoder to decode all codes can be designed.

The details of one or more implementations are set forth in the accompanying drawings and the description below. Other features, aspects, and advantages will become apparent from the description, the drawings, and the claims.

BRIEF DESCRIPTION OF THE DRAWINGS

FIG. 6 is an example of a schematic of a progressive transmission encoder.

FIG. 7 is a schematic of an example puncturer for a progressive transmission scheme.

Like reference numbers and designations in the various drawings indicate like elements.

DETAILED DESCRIPTION

An Irregular Systematic with Serial Concatenated Parity (Ir-S-SCP) code is an S-SCP code with varying inner or outer codes. Irregularity can be used to reduce $E_b/N_o$ (per bit signal to noise ratio) requirements to quite near the constrained capacity. $E_b/N_o$ is the ratio of the energy per bit to the noise power spectral density, sometimes referred to as the per bit signal to noise ratio. A lower $E_b/N_o$ requirement means either that less power can be used for the transmission or that the transmission will succeed in the face of larger noise. Heuristic optimization techniques based on density evolution or Extrinsic Information Transfer (EXIT) charts can be used as an aid to irregular design. These techniques simulate the performance of the code in the limit of infinite block size and, usually, infinite iterations. In some implementations, the Ir-S-SCP codes can have an inner code including a punctured accumulator ($G(D)=1/(1+D)$) and an irregular outer code including a duo-binary encoder ($G(D)=1+D$) with outputs that are repeated a variable number of times. For example, the S-SCP code can be a two-state regular S-SCP code with the above inner and outer code polynomials and outer code outputs repeated twice.

Figure 1A:
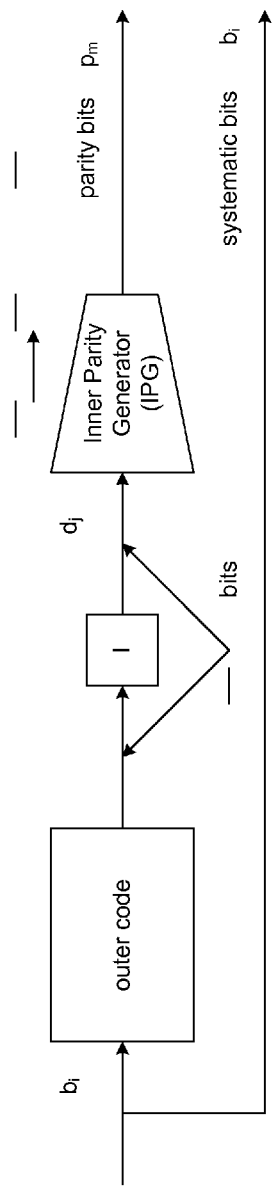
FIGS. 1A, 1B, and 1C represent schematics of a general Ir-S-SCP code structure, a structure of the two-state Ir-S-SCP codes, and a structure of the systematic IRA code, respectively.
Figure 1B:
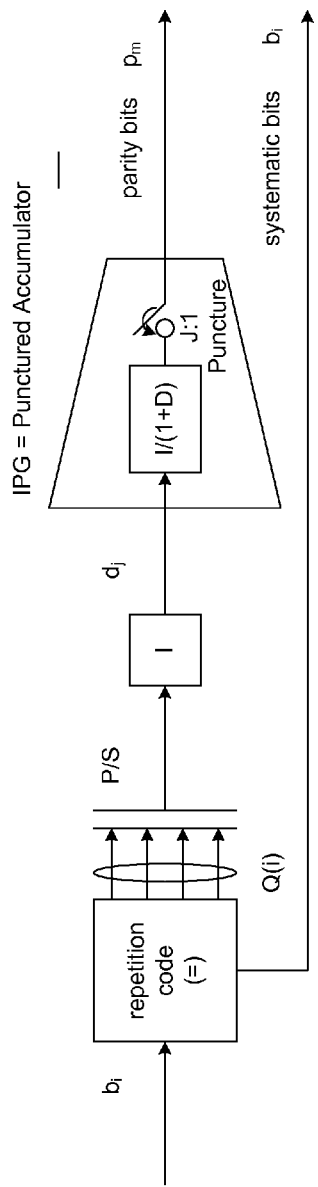
Figure 1C:
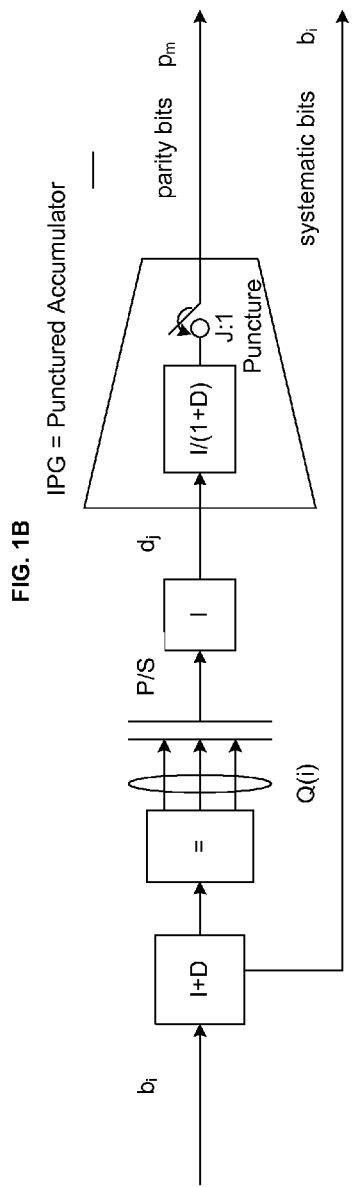

FIGS. 1A, 1B, and 1C represent a general Ir-S-SCP code structure, a structure of the systematic IRA code, and a structure of the example two-state Ir-S-SCP codes, respectively. In some examples, the IRA codes can be a sub-class of S-SCP codes with $G(D)=1$ outer codes. In other examples, the example codes with outer $G(D)=1+D$ can be treated as S-SCP and outer $G(D)=1$ as repeat accumulate (RA) codes. The number of times that a bit i from the outer code is repeated is represented by Q(i), and the average repetition factor for a code is represented by Q'. The rate of the puncturer after the inner code is represented by J, and the ratio between the number of output bits from the outer code and the number of parity bits is calculated. The rate of such an Ir-S-SCP is represented by equation 1.

$$r = \frac{J}{J + Q'} \quad (1)$$

The following portion describes EXIT chart based optimization of Ir-S-SCP codes. Because of the similarity between S-SCP and serially-concatenated codes, the optimization heuristics for irregular serially-concatenated codes can be used, with slight modification, to design irregular S-SCP codes. Both methods rely on EXIT curves, which are characterizations of component codes based on the single variable of mutual information between the extrinsic likelihoods and their true values for the bits passing through the interleaver of a concatenated code. When applied to irregular designs, these methods exploit the property that the EXIT curve of a mixture of codes is a linear mixture of the EXIT curves of the individual codes. This excludes interaction through trellis state at points where the code used is varied. In both methods, a fixed inner code is assumed and optimization is performed by using an EXIT chart of the EXIT curve of the inner code and the EXIT curve of mixtures of outer codes to predict performance.

In particular, for a code to be decodable, the EXIT curve of the inner code must lie above the EXIT curve of the outer code. For a serial code, only the inner code is directly in contact with the channel, so the EXIT charts of the outer code are not a function of channel SNR. With S-SCPs, both inner and outer codes are directly in contact with the channel, requiring that EXIT curves for both curves be created at each signal-to-noise (SNR) of interest. In some implementations, an initial mixture of codes expressed as a vector of positive fractions of coded bits from each code is repeatedly projected onto constraints on the rate of the outer code and the existence of a decoding tunnel between the EXIT curves of the two codes. If a code mixture is found that satisfies those constraints, the technique uses a gradient search to find the curve with lowest mean-square distance between the EXIT curves which satisfies the constraints. If no code mixture is found that satisfies the constraints, the code is determined to be below threshold. In some implementations, the constraint requiring the existence of a decoding tunnel is relaxed and a gradient search is performed for the code with the largest mutual information after a fixed number of iterations on the EXIT chart.

In some implementations, the optimization for finite iterations can be performed using the Nelder-Mead Simplex nongradient method. In such implementations, the problem is formulated as a standard simplex optimization, where the dimensions of the simplex are chosen as the smallest number needed to meet the rate constraint: the number of individual or even mixtures of two outer codes, expressed, e.g., as pairs of positive weights that sum to one, that have the desired rate at the interleaver During optimization, a unit-sum, positive vector in this space with the largest mutual-information is selected. To meet the constraint that the selected fractions sum to one, one dimension is excluded from the optimization. An objective function that returns less than zero when the inner and outer curves meet is used. The mutual information of the log-likelihood ratios at the end of the iteration forms the problem as a standard Nelder Mead Simplex maximization. This method can be extended to designs with irregular inner codes.

This portion describes the complexity versus performance trade-off of IRA and Ir-S-SCP codes. Iterative decoders for turbo-like codes are sub-optimal and exhibit a trade-off between computational complexity and error-rate. The trade-off of complexity vs. performance can be expressed in terms of block error rate (BLER) and 2-state trellis sections. Operation counts for each design that justify the use of trellis sections as a measure of complexity is provided. The computation done in the decoder for RA and two-state S-SCP codes on each iteration is expressed as $g(\cdot)$ and addition operations where $$G(x, y) = \min^*(x, y) - \min^*(0, x+y)$$

and $\min^*$ is a log-sum:

$$\min^*(x, y) = \log\left[\exp(x) + \exp(y)\right] = \min(x, y) - \log[1 + \exp(-|x-y|)]$$

The per-decoded-bit, per-iteration complexity is listed as $\{C_g, C_+\}$ for the codes considered is listed in Table 1.

TABLE 1

Code parameters for five RA (2-state S-SCP) codes

| | Regular S-SCP | Low Threshold Ir-S-SCP | Low Complexity Ir-S-SCP | Low Threshold Jin IRA | Low Complexity IRA |
|---|---|---|---|---|---|
| Q' | 2 | 4 | 3 | 8 | 5 |
| Q | repetitions | | | Repetitions | |
| 2 | 1024 | 704 | 444 | 0 | 0 |
| 3 | 0 | 0 | 462 | 685 | 574 |
| 4 | 0 | 80 | 30 | 0 | 190 |
| 5 | 0 | 0 | 26 | 0 | 0 |
| 6 | 0 | 0 | 1 | 0 | 40 |
| 7 | 0 | 0 | 25 | 0 | 24 |
| 8 | 0 | 184 | 16 | 0 | 25 |
| 9 | 0 | 0 | 7 | 0 | 38 |
| 10 | 0 | 0 | 5 | 0 | 32 |
| 11 | 0 | 0 | 1 | 57 | 18 |
| 12 | 0 | 0 | 2 | 221 | 5 |
| 13 | 0 | 0 | 0 | 0 | 28 |
| 14 | 0 | 0 | 1 | 0 | 18 |
| 15 | 0 | 0 | 0 | 0 | 18 |
| 16 | 0 | 56 | 1 | 0 | 14 |
| 17 | 0 | 0 | 1 | 0 | 0 |
| 21 | 0 | 0 | 1 | 0 | 0 |
| 23 | 0 | 0 | 1 | 0 | 0 |
| 46 | 0 | 0 | 0 | 35 | 0 |
| 48 | 0 | 0 | 0 | 26 | 0 |
| $C_{TS}$ | 3 | 5 | 4 | 8 | 5 |
| $C_G, C_+$ | 9, 7 | 15, 11.3 | 12, 9.6 | 24, 17 | 15, 11 |
| $(E_b/N_o)^*$ dB | 0.88 | 0.35 | 0.69 | 0.35 | 0.6 |

For the codes listed in Table 1, each two-state trellis-section requires three $g(\cdot)$ operations and 2-2.5 additions. Since the complexity of the $g(\cdot)$ operations, though architecture dependent, is several times that of an addition, the average complexity per trellis each of the codes is almost identical. Thus, the trellis sections can be used as a clear, single-dimensional measure of complexity. In Table 1, the complexity in two-state trellis sections per decoded bit is listed as $C_{TS}$. For IRA codes, $C_{TS} = Q'$, while for the S-SCP codes, $C_{TS} = Q'+1$. For both codes, smaller Q' gives lower per-iteration complexity. The typical Q' of a good Ir-S-SCP code is smaller than that of a good IRA code.

For the S-SCP codes, the outer and inner code are inverse operations: G(D) for the inner code is 1/G(D) for the outer code. Since the soft-in, soft-out (SISO) decoder performs both probabilistic encoding and decoding, the SISOs of a function and its inverse are identical, just with the sense of which variables are "coded" and which are "uncoded" switched. Thus, in this example, the SISO(s) used for decoding the inner code during one half of an iteration may be used to decode the outer code in the other half of an iteration. For some hardware architectures, the area of decoders for this code will scale directly with Q'.

A pair of rate-½ codes are considered, where the rate-½ codes are designed to give low thresholds for large block sizes. The IRA is compared with the average repetition Q'=8 and a minimum degree with an irregular S-SCP (Q'=4) designed for low threshold using the EXIT chart method previously described, as well as the regular two-state S-SCP code. The two irregular codes were simulated using repetition profiles of period 1024. In Table 1, the Q column lists repetition factors while the repetitions column for each code indicates the number of inputs, out of each 1024, that are repeated by each repetition factor. Table 1 also lists the complexity per input bit for each code in terms of $g(\cdot)$ and + operations as $\{C_g, C_+\}$ and in terms of trellis-sections as $C_{TS}$. The last row in Table 1, labeled $(E_b/N_o)^*$ dB, lists the approximate $E_b/N_o$ threshold of each code, as calculated on an EXIT chart. The EXIT threshold calculated for both irregular codes is 0.35 dB and agrees closely with the threshold obtained via density evolution for IRA codes. The threshold is similar to those of unstructured LDPC codes.

Figure 2:
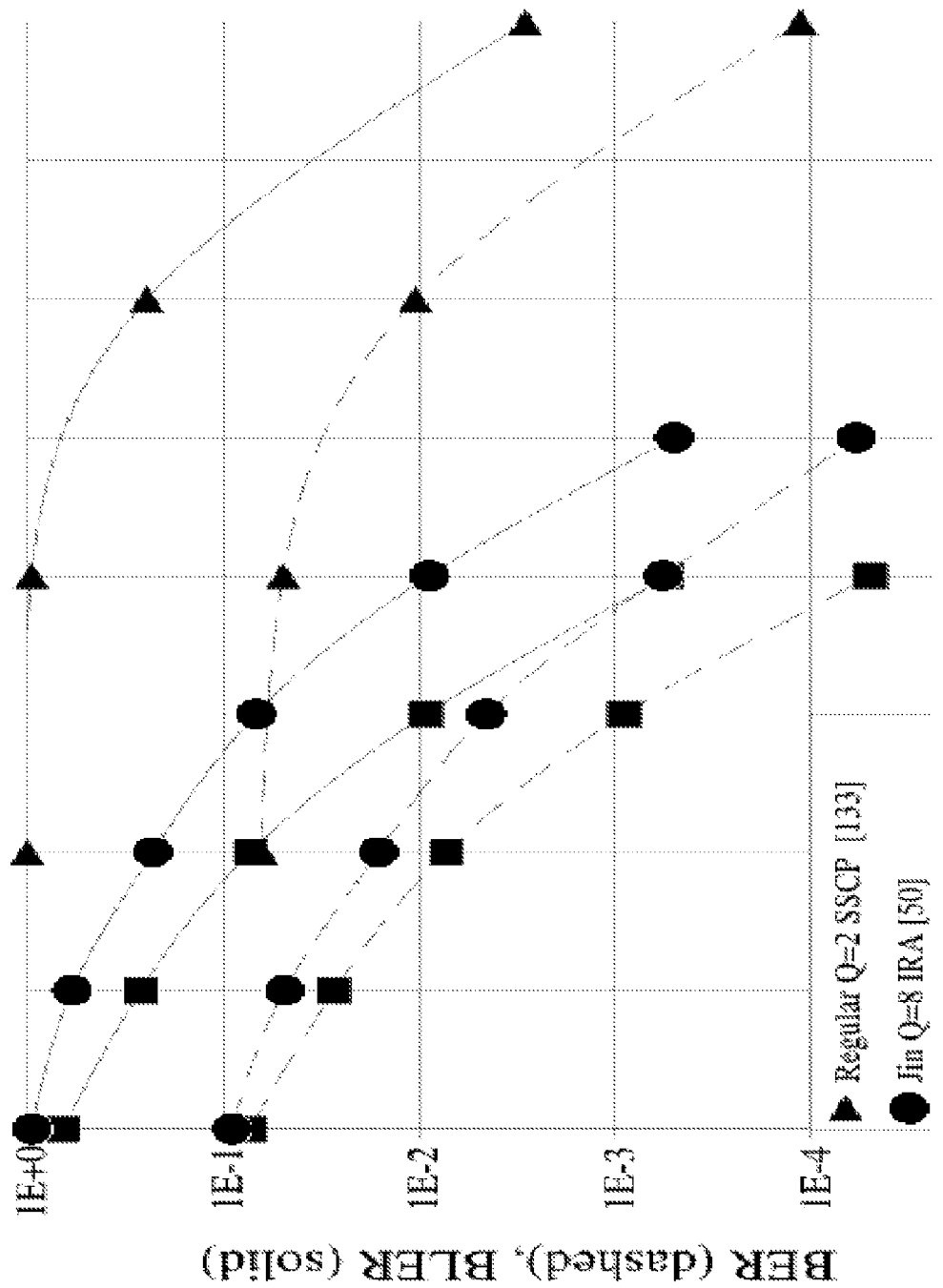
FIG. 2 is a plot depicting BER and BLER vs. $E_b/N_o$ for low threshold IRA.

FIG. 2 depicts block error rate (BLER) and bit error rate (BER) vs. $E_b/N_o$ curves for the low threshold Ir-S-SCP and IRA, and the regular S-SCP codes at a complexity of 400 trellis sections per input bit, a large complexity figure equivalent to, respectively, 80, 50, and 133 iterations at a block size k=16384 input bits. FIG. 2 depicts large block size BER and BLER vs. $E_b/N_o$ for low threshold IRA, Ir-S-SCP, and regular S-SCP codes with, respectively, 50, 80, and 133 iterations (400 2-state trellis sections), k=16384, r=½. Note that that block size is one of the larger ones used in current communication systems. At this fixed complexity, the Ir-S-SCP shows a 0.05 dB gain over the IRA and a 0.2 dB gain over the regular code.

Figure 3:
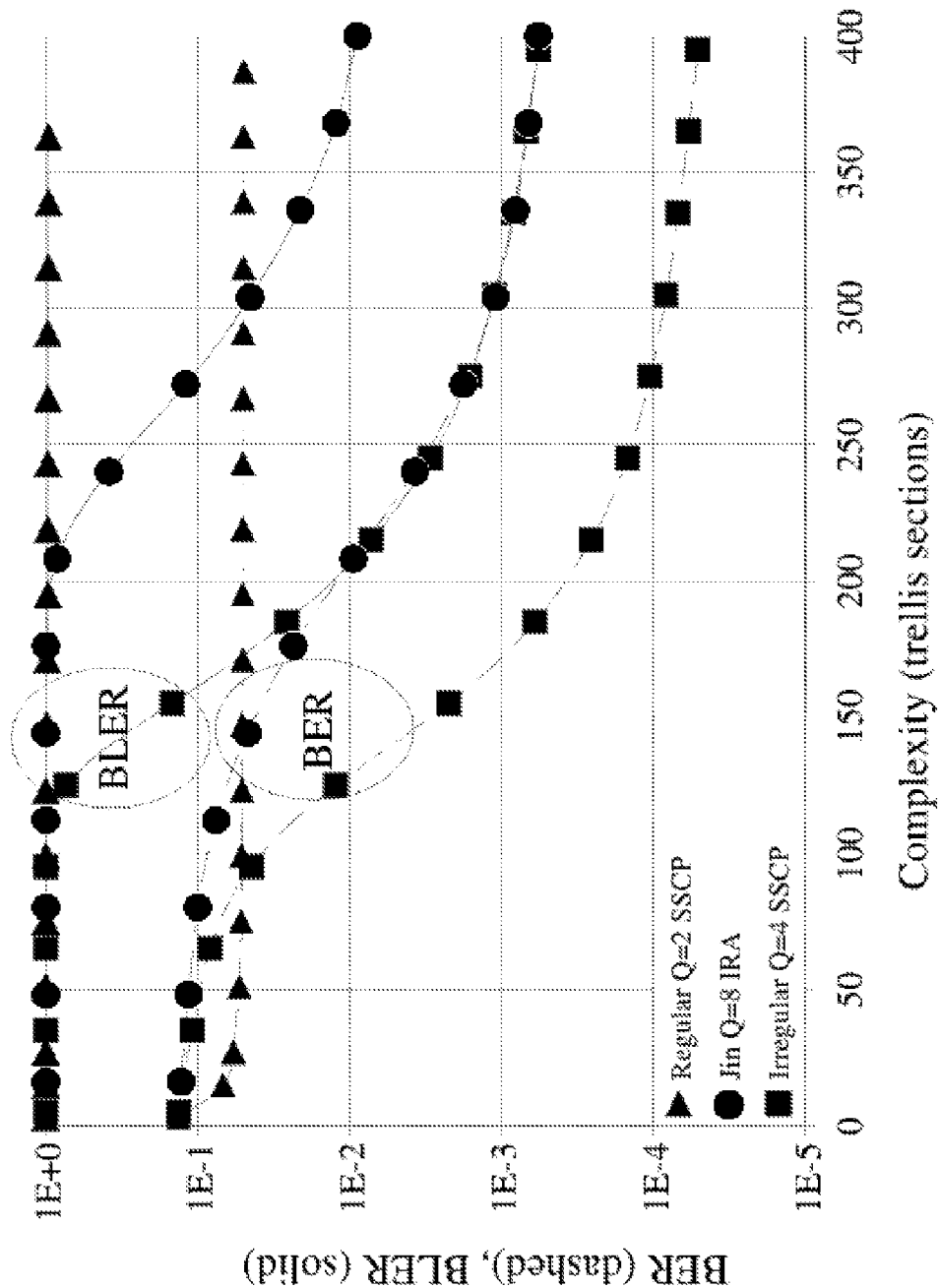
FIG. 3 is a plot depicting large block size BER and BLER vs. computational complexity.

FIG. 3 depicts BLER and BER vs. complexity curves for the same codes and block size at $E_b/N_o$=0.9 dB. FIG. 3 depicts large block size BER and BLER vs. computational complexity in 2-state trellis sections for low threshold IRA, Ir-S-SCP, and regular S-SCP codes at $E_b/N_o$=0.9 dB, k=16384, r=½. The low-threshold Ir-S-SCP code reaches the performance of the low-threshold IRA code with approximately 60% of the computational complexity. This is also, roughly, the difference in per-iteration complexity: ⅝. Further, low-complexity IRA and Ir-S-SCP codes targeting rate-½ and k=1024 were designed. The repeat profiles of these codes are listed in Table 1.

Figure 4:
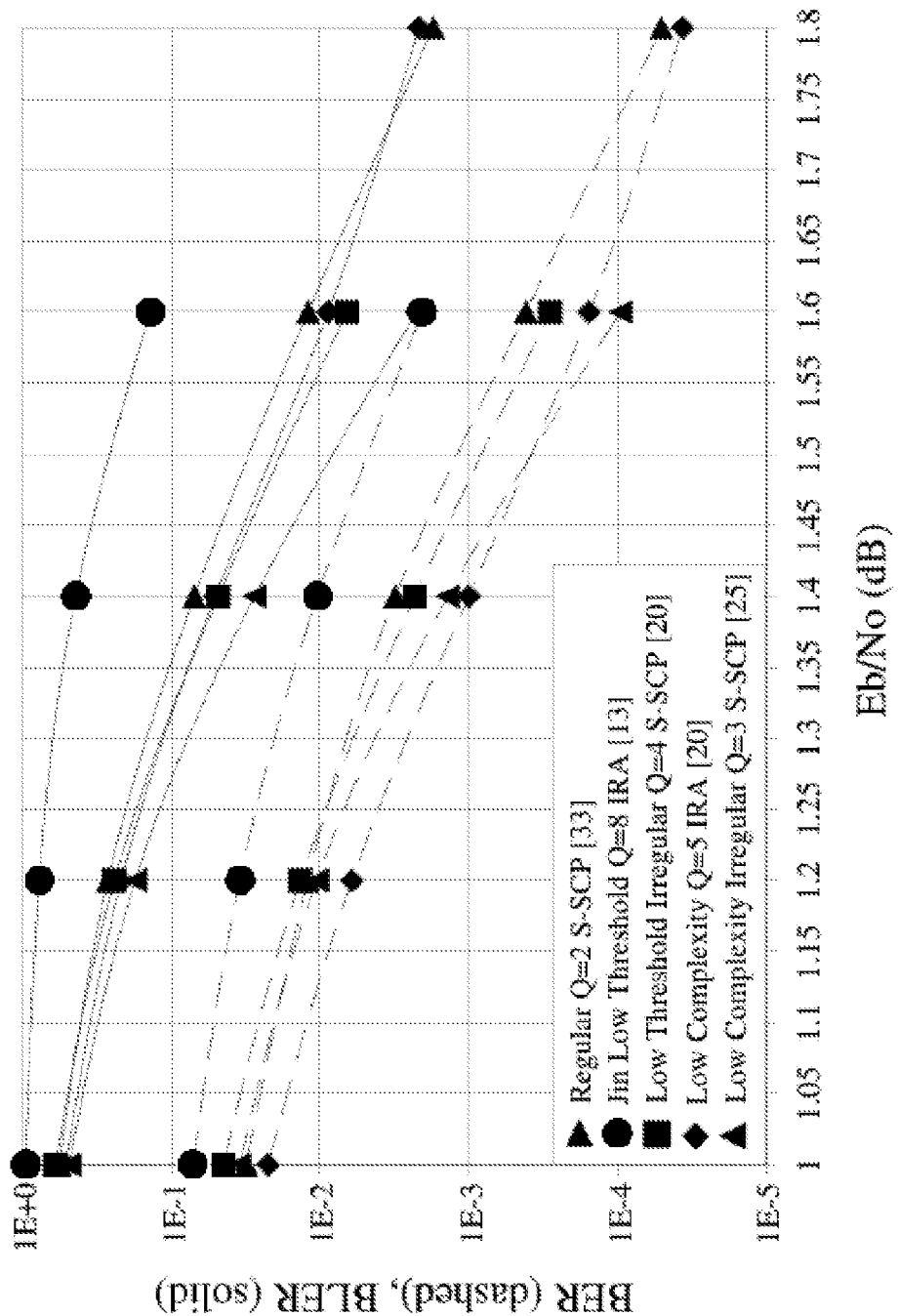
FIG. 4 is a plot depicting moderate block size BER and BLER vs. $E_b/N_o$.

FIG. 4 depicts BLER and BER vs $E_b/N_o$ for these low-complexity designs as well as for the low threshold designs and the regular code at a fixed complexity of 100 trellis sections. FIG. 4 depicts moderate block size BER and BLER vs. $E_b/N_o$ for regular S-SCP, low-complexity S-SCP, and IRA, and low threshold Ir-S-SCP and IRA codes with 33, 25, 20, 20, and 13 iterations (100 2-state trellis sections), k=1024, r=½. Here the low-complexity Ir-S-SCP code shows a BLER advantage of approximately 0.05 dB over both the low-complexity irregular repeat accumulate code and the low-threshold irregular S-SCP code and more than 0.3 dB over the low threshold IRA code.

Figure 5:
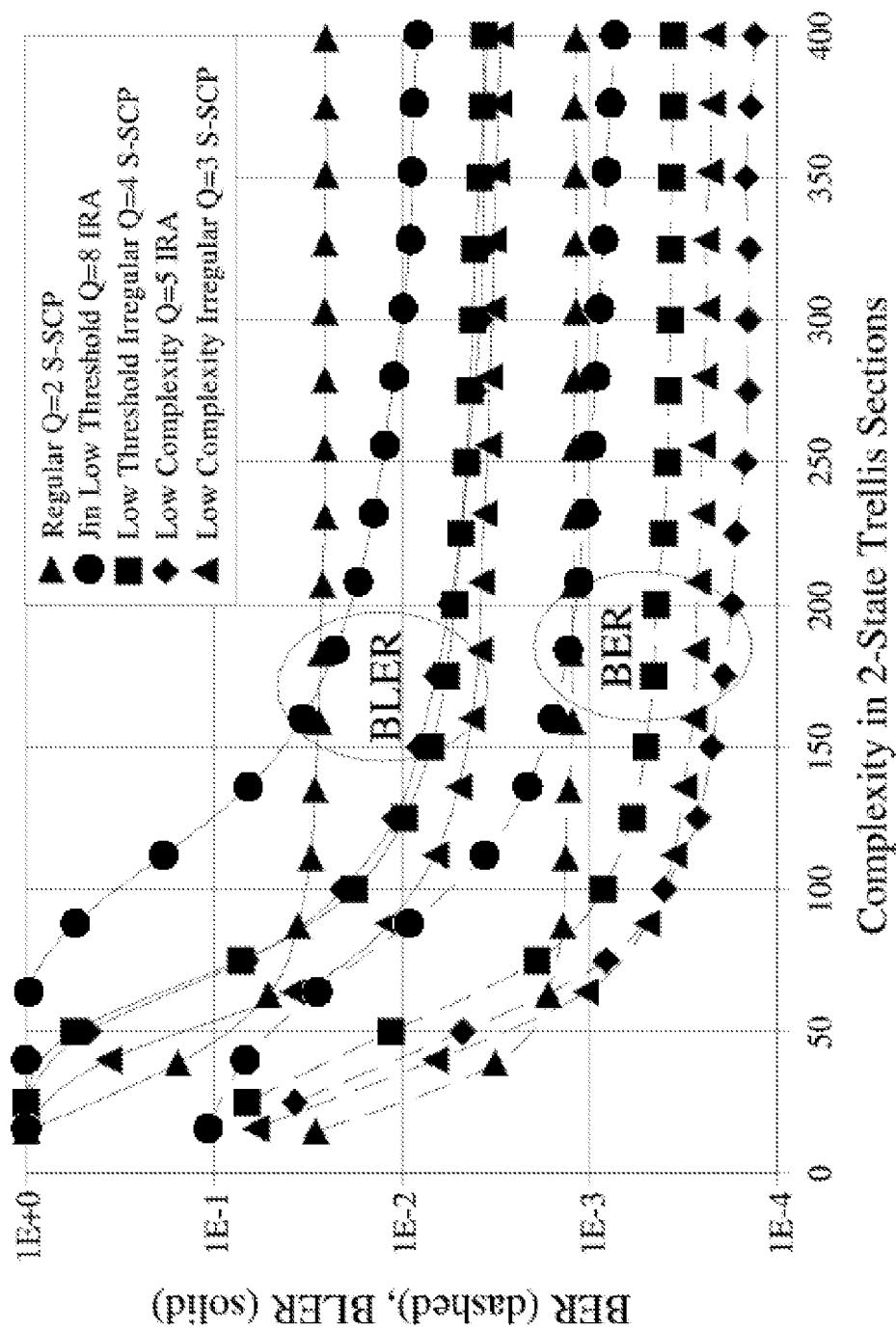
FIG. 5 is a plot depicting moderate block size BER and BLER vs. complexity.

FIG. 5 depicts BLER and BER vs. complexity curves for these codes at $E_b/N_o$=1.5 dB. FIG. 5 depicts moderate block size BER and BLER vs. complexity for regular S-SCP, low-complexity IR-S-SCP, and IRA, and low threshold Ir-S-SCP and IRA codes at $E_b/N_o$=1.5 dB, k=1024, r=½. Here, the low-complexity Ir-S-SCP code shows a computational complexity advantage in BLER of approximately 75%—similar to the per-iteration complexity advantage of ⅘—over both the low complexity IRA and low-threshold Ir-S-SCP codes and much larger complexity gains over the low threshold IRA code. The regular S-SCP gives the lowest BLER until a complexity of 60 trellis-sections per bit but shows little iteration gain beyond that.

This portion describes Ir-S-SCPs for incremental redundancy with incremental complexity. Incremental redundancy is a hybrid-ARQ technique that can be used in cellular systems. In such implementations, a high-rate code word is first sent. If a receiver fails to decode this codeword, each "retransmission" is composed of additional bits that, together with all previously transmitted bits, form a codeword of a lower rate code. Here the codewords for higher rates can be seen as punctured versions of codewords from lower rates. An incremental redundancy scheme based on uniform puncturing of parity bits from a systematic mother code has been adopted into CDMA2000 1XEV-DO. With uniform puncturing of parity bits from a turbo-like code, regardless of the rate of the code, the decoder must process each trellis section of the mother code. Each punctured parity bit allows the decoder to perform two fewer additions per iteration, but this saving is small and may not translate into an area saving or speed increase in a hardware implementation.

For S-SCP codes, using uniform puncturing of parity bits to provide incremental redundancy would create a family of codes for which the Q distribution is fixed by the Q distribution of the lowest rate code and the J parameter increases with the rate. Fixing the Q distribution both fixes the per-iteration complexity of the code regardless of the code rate and allows for an optimal design only at one rate.

In some implementations, in order to allow for a better performance vs. complexity trade-off over a wide range of rates, at any rate, an optimal Q' and J, and a near optimal Q distribution is selected. As the rate increases, the optimal Q' reduces, reducing the size of the interleaver and the number of trellis sections of the inner code. To reduce Q' through puncturing, puncturing is used to remove sections from the end of the inner trellis and, in the process, corresponding bits from the end of the codeword are removed. Without any additional structure to the code, reducing the size of the interleaver will produce Qs of 1 and 0, leading to a loss in interleaver gain and reduced BER and BLER performance. An interleaver structured to produce a desirable Q distribution for the highest rate codes will produce interleaver gain for all lower rates.

FIG. 6 is a schematic representation of an encoder for such a progressive transmission S-SCP code with two interleaver component. FIG. 6 depicts a progressive transmission encoder with a two-component interleaver for a $G_o(D)$=1+D, $G_i(D)$=1/(1+D) Ir-S-SCP family. In some implementations, the structured interleaver for an incremental redundancy code with incremental complexity can include two or more parallel interleavers. FIG. 7 depicts examples of puncture patterns for the schematic shown in FIG. 6, where the rates chosen are ⅕, ⅓, and ⅔, from an example code with k=1024, component interleavers chosen are for 2048 and 4096 bits, and Q' ranges from 6 to 2. In alternate implementations, other inner and outer codes, other rates, other input and output block lengths, other Q' and J, other Q distributions, other interleaver sizes and splits, and other repetition profiles can be chosen. The Q distributions of the interleaver and its components are listed in Table 2. FIG. 7 depicts an example puncturer for a progressive transmission scheme, x's represent punctured bits, o's transmitted bits, and o's new bits to transmit: (a) r=⅔, Q'=4, 2048 trellis sections, (b) r=⅓, Q'=4, J=2, 4096 trellis sections, (c) r=⅕, Q'=6, 6144 trellis sections.

TABLE 2

Repetition profiles for incremental redundancy Ir-S-SCP

|   | min | Δ | Full |
|---|---|---|---|
| I | 2048 | 4096 | 6144 |
| Q' | 2 | 4 | 6 |
| Q | | Rep., Period = 128 | |
| 0 | | 38 | |
| 2 | 128 | 53 | 38 |
| 4 | | | 53 |
| 6 | | 18 | |
| 8 | | | 18 |
| 14 | | 17 | |
| 16 | | | 17 |
| 30 | | 2 | |
| 32 | | | 2 |

The code parameters for each rate are listed in Table 3. One period of each puncture pattern in Table 3 is displayed in bold font. Incremental bits for each rate are underlined.

TABLE 3

Code parameters for incremental redundancy Ir-S-SCP

| Rate | I | Q' | J | Puncture Pattern |
|---|---|---|---|---|
| 8/9 | 2048 | 2 | 16 | xxxxxxxxxxxxxxxxo |
| 4/5 | 2048 | 2 | 8 | xxxxxxxoxxxxxxxo |
| 2/3 | 2048 | 2 | 4 | xxxoxxxoxxxoxxxo |
| 1/2 | 3072 | 3 | 3 | xxxoxxxoxoxoxxxo |
| 1/3 | 4096 | 4 | 2 | xoxoxoxoxoxoxoxo |
| 1/5 | 6144 | 6 | 1.5 | xoooxoxoooxoxooo |

In Tables 2 and 3, I represents the size of the interleaver which is also the complexity in trellis sections of the inner code.

Figure 8:
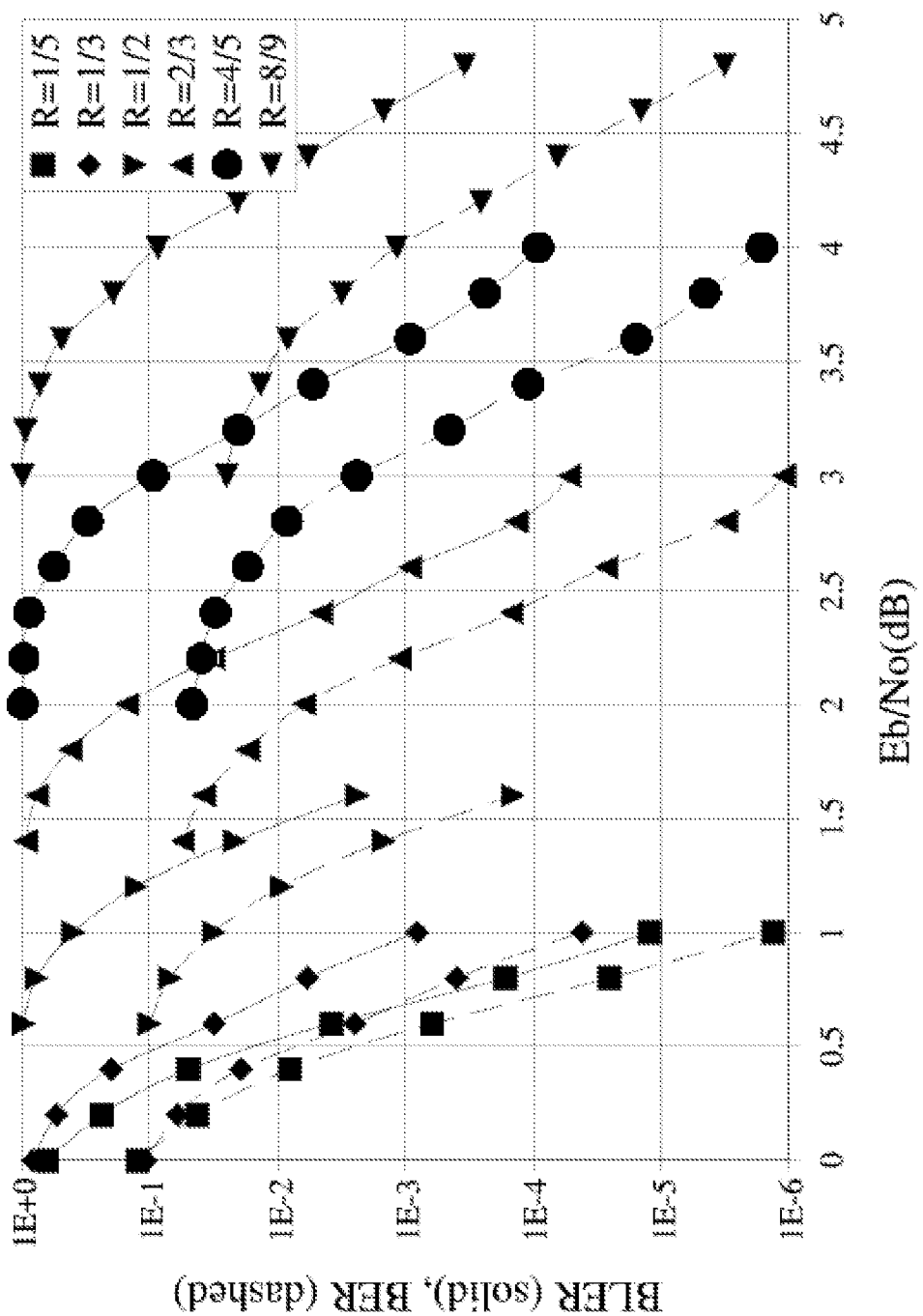
FIG. 8 is a plot depicting BER and BLER vs. $E_b/N_o$.

FIG. 8 depicts performance curves for this code at six rates. FIG. 8 depicts plot of BER and BLER vs. $E_b/N_o$ for k=1024, r=1/5, 1/3, 1/2, 2/3, 4/5, 5/6, Q'=6, 4, 3, 2, 2 progressive transmission with progressive complexity Ir-S-SCP code. The 6144 bit interleaver is derived from a 2048 bit interleaver for rates ≧2/3 and a 4096 bit interleaver. The repetition profile after the outer code is scrambled. These curves are within 0.2 dB of $E_b/N_o$ of those for good Ir-S-SCP point designs. One component of this interleaver is designed for the highest code rate to be considered, and at this highest rate, the puncturer selects only bits output from this component. In FIG. 6, this interleaver component is labeled "high rate" and the repetition profile on the inputs to it is labeled $Q_{min}(i)$. The puncture pattern used for this high-rate code is listed as (a) in FIG. 7, and, in this example, $Q_{min}(i)=2$, r=2/3, and the code has 2048 trellis sections. This high-rate interleaver component can ensure interleaver gain at all rates. At the lowest rate, the puncturer selects bits from all sections of the composite interleaver. Any interleaver components beyond the highest rate interleaver may be designed such that the Q distribution of the composite interleaver is optimal. For the two-component interleaver in FIG. 6, the difference distribution $Q_\Delta(i)$, which describes the inputs to the second interleaver component—marked "low rate"—is designed so that $Q_{min}(i)+Q_\Delta(i)$ is drawn from the optimal Q distribution for the lower rate.

Puncture pattern (c) in FIG. 7 illustrates the puncture pattern for the example lowest-rate, a r=1/5, Q'=6 code which has 6144 inner trellis sections. At intermediate rates, the puncturer operates at the J of the optimal Q distribution for that rate. There should be, at most, a small mismatch between the actual Q distribution and this desired Q distribution. The puncture pattern used for the example intermediate r=1/3 code is listed as (b§in FIG. 7. This rate has Q=4 and 4096 inner trellis sections.

Figure 9:
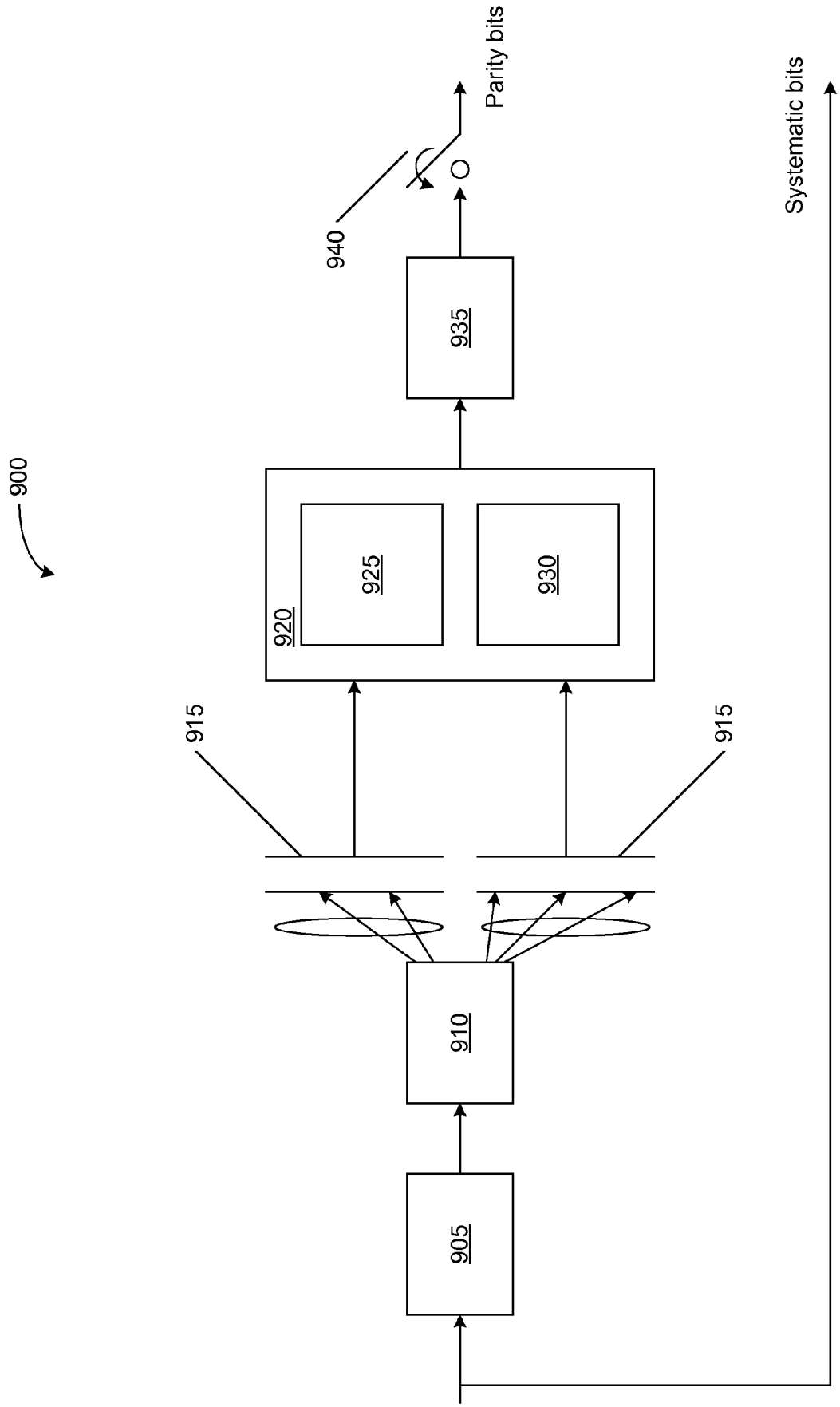
FIG. 9 is an example of a schematic of a system for transmitting an Ir-S-SCP code.

FIG. 9 depicts a schematic of an example of a system 900, e.g., a two state Ir-S-SCP code generating system, for generating parity bits. The system 900 includes a generator 905 that generates bits of code. In some implementations, the generator 905 can generate i bits based on a generator function, G(D)=1+D. The input to the generator 905 can be x[i], the output to the generator 905 can be y[i], and the input and the output can be related by y[i]=x[i]+x[i−1]. The system 900 can include a repetition unit 910 which can repeat each bit output by the generator 905 a pre-determined number of times. In some implementations, the number of times that a bit can be repeated by the repetition unit 910 can be variable. In other implementations, this number can be fixed. In some implementations, the repetition unit 910 can receive (m+n) bits from the generator 905 and can repeat the m bits p number of times and the n bits q number of times.

The system 900 can further include a parallel to serial conversion unit 915 to serialize the bits output by the repetition unit 910. In some implementations, the system 900 includes more than one parallel to serial conversion unit 915. In such implementations, a first set of repeated bits output by the repetition unit 910 can be input to a first parallel to serial conversion unit 915 and a second set of repeated bits output by the repetition unit 910 can be input to a second parallel to serial conversion unit 915. In some implementations, the m bits repeated p number of times by the repetition unit 910 can be input to a first parallel to serial conversion unit 915. The n bits repeated q number of times by the repetition unit 915 can be input to a second parallel to serial conversion unit 915. The system 900 includes an interleaver 920 configured to interleave the serialized bits output by the parallel to serial conversion unit 915. The interleaver 920 can include a high rate unit 925 and a low rate unit 930. The high rate unit 925 can store a first set of the repeated bits received by the interleaver 920. The low rate unit 930 can include a second set of the repeated bits received by the interleaver 920. For example, if 6144 bits are output by the generator 905 and the repetition unit 910, then the high rate unit 925 can store the first 2048 bits and the low rate unit 930 can store the remaining 4096 bits.

The system 900 can further include a code accumulator 935 governed by a function, e.g., G(D)=1/(1+D). In this example, the output, y[i], can be determined using the equation, y[i]=y[i−1]+x[i]. The additions, performed by the generator 905 and the code accumulator 935, are mod 2 addition where x and y are binary. Other examples of functions to generate and accumulate bits can be used by the generator 905 and the code accumulator 935, respectively. In some examples, the code generated by the generator 905 can be called the outer code, while the code generated by the code accumulator 935 can be termed the inner code. In some implementations, as illustrated in FIG. 1, the code accumulator 935 generating the inner code can be an inner parity generator. The code accumulator 935 can output fewer bits than it receives as input. In some implementations, the code accumulator 935 can operate on some number of consecutive bits from interleaver 920 that is less than the full number of bits output by interleaver 920. The system 900 includes a puncturer 940 configured to select only some bits output from the code accumulator 935. In some implementations, the rate of the puncturer 940 after the code accumulator 935 can be represented by j, and can be calculated as the ratio between the number of output bits from the code accumulator 935 and the number of parity bits. For example, the rate of an Ir-S-SCP unit, r, can be represented by equation 1. The system 900 can include a transmitter (not shown) to transmit the parity bits and the systematic bits to a receiver (not shown). The parity bits and the systematic bits can represent the Ir-S-SCP. In some implementations, the system 900 can include a receiver (not shown) to receive the encoded Ir-S-SCP code. For example, the receiver can include a demodulation circuit that provides soft decision information on the transmitted bit stream to an iterative decoder. In addition, the system 900 can include a decoder (not shown) to decode the Ir-S-SCP. For example, the decoder can include an iterative decoder configured to successively perform SISO decoding of the various constituent components of the Ir-S-SCP code design in a pre-determined method of decoding.

Figure 10:
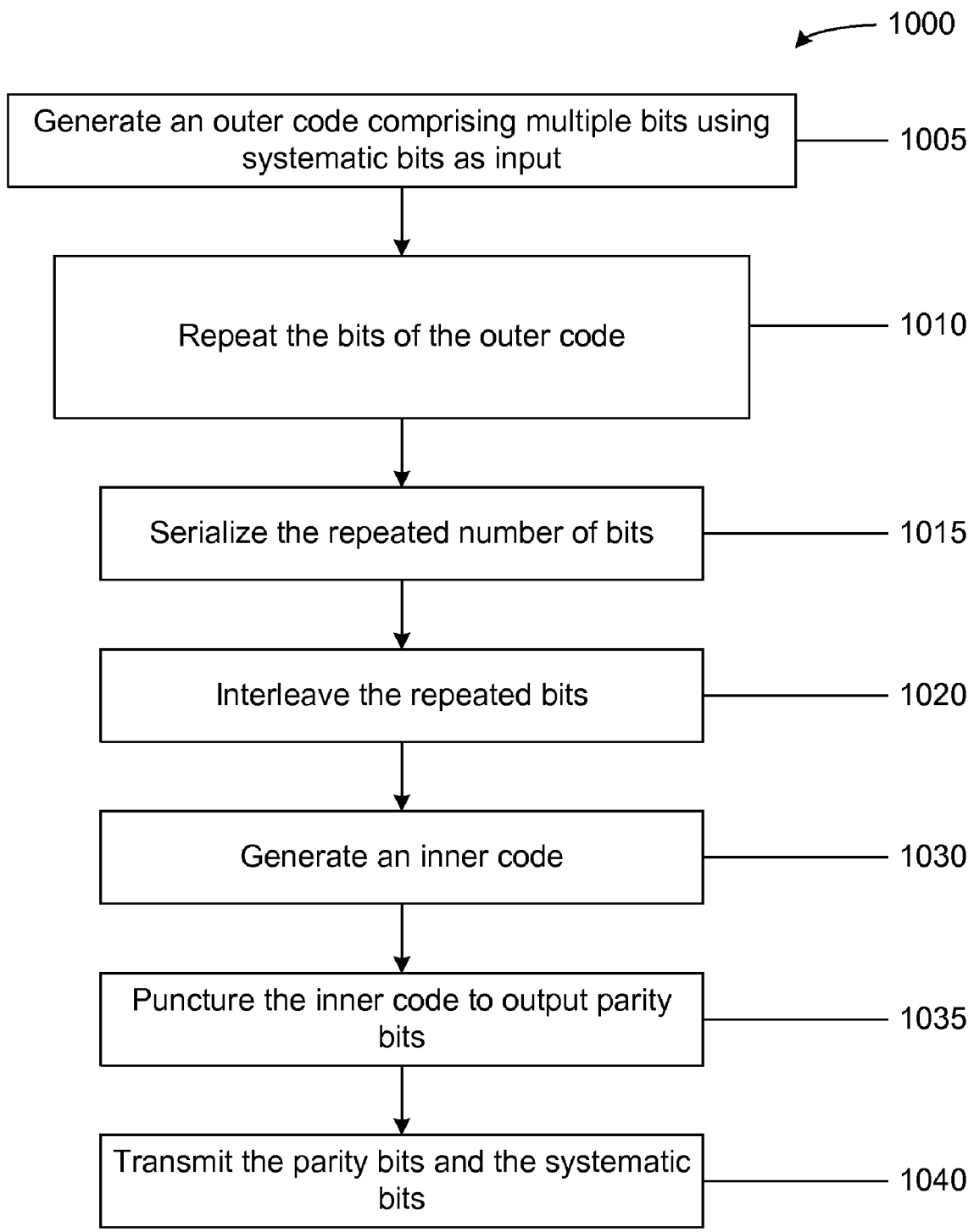
FIG. 10 is a flow chart of an example of a process for transmitting an Ir-S-SCO code.

FIG. 10 is a flow chart depicting an example of a process 1000 for transmitting an Ir-S-SCP code. The process 1000 includes generating an outer code at 1005, where the outer code includes several bits, and where the generator uses systematic bits as input. For example, a generator 905 can use a generator function, e.g., G(D)=1+D, to generate an outer code. The process 1000 includes repeating each bit of the outer code a pre-determined number of times to form a repeated bits at 1010. For example, the repetition unit 910 can repeat each bit of the outer code p number of times and again q number of times. In some implementations, the repetition unit 910 can repeat the bits of code twice. The process 1000 can include serializing the repeated number of bits at 1015. In implementations, where the bits are repeated twice, a first parallel to serial conversion unit 915 can be used to serialize the first set of repeated bits of the outer code and a second parallel to serial conversion unit 915 can be used to serialize the second set of repeated bits of the outer code. The system 900 can include multiple parallel to serial conversion units where the number of parallel to serial conversion units can match the number of times the bits in the code are repeated.

The process 1000 can include interleaving the repeated bits at 1020. For example, an interleaver 920 can interleave the bits that are input to the interleaver from the parallel to serial conversion units 915. The interleaver 920 can include a high rate unit 925 to interleave the first repeated bits output by the first parallel to serial conversion unit 915. The interleaver 920 can also include a second high rate unit 930 to interleave the second repeated bits output by the second parallel to serial conversion unit 930. The process 1000 can generate an inner code at 1030. For example, a code accumulator 935 can receive the output of the high rate unit 925 and the low rate unit 930. The process 1000 can puncture the inner code to output parity bits at 1035. For example, a puncturer 940 can puncture the parity bits, wherein the puncturing is non-uniform, and the puncturing is based at least in part on an incremental redundancy scheme. The process 1000 can transmit the parity bits and the systematic bits at 1040. For example, a transmitter (not shown) can transmit the parity bits output by the puncturer 940 and the systematic bits input to the generator 905, e.g., to a receiver, wherein the parity bits and the systematic bits comprise the Ir-S-SCP code.

In some implementations, puncturing the inner code based at least in part on the incremental redundancy scheme can include selecting at least one of a repetition profile, Q', a fraction of bits to puncture, J, and an average number of repetitions per outer code, Q, of the inner code and the outer code. Selecting a higher rate, J, causes a decrease in Q'. The repetition profile, the fraction of bits to puncture, and the repetition distribution are optimized such that the performance of the transmitted Ir-S-SCP is comparable to a performance of point design generated Ir-S-SCP. In some implementations, the inner code can be punctured to remove one or more sections near the end of the inner code, causing a decrease in the length of the inner code. The inner code can be punctured based on a puncture pattern. For example, the fraction of bits to puncture can be ⅕, the number of systematic bits can be 1024, the first portion of the outer code can consist of 2048 bits, subsequent to repetition, and the second portion of the outer code can consist of 4096 bits, subsequent to repetition.

Particular implementations have been described. Other implementations are within the scope of the following claims. For example, the actions recited in the claims can be performed in a different order and still achieve desirable results. For example, the EXIT chart design method described previously assumes that there is little interaction between the trellis-sections corresponding to bits that are repeated a different number of times. For smaller block sizes, grouping high repetition degree trellis sections on the outer code into small interleaver components may increase the difficulty of avoiding short cycles. For these block sizes, few interleaver components can be used to avoid grouping high repetition degree outer trellis sections together. This mixing of different repetition degree trellis sections can further reduce the accuracy of the already approximate EXIT chart design method. A more accurate EXIT chart design method would model the repetition code separately from the outer code, describing the soft-information passing from the outer code to the repetition code using a single variable or one variable per interleaver component. Optimization methods, other than EXIT charts, can be used. For example, the optimization for finite iterations using the Nelder-Mead Simplex non-gradient method can be used by choosing the dimensions of the simplex as the smallest number needed to meet the rate constraint: the number of individual or even mixtures of two outer codes (expressed as pairs of positive weights that sum to one) that have the desired rate at the interleaver.

What is claimed is:

1. A method for transmitting an Irregular Systematic with Serially Concatenated Parity (Ir-S-SCP) code, comprising:
   generating an outer code comprising a plurality of bits using systematic bits as input;
   repeating the plurality of bits of the outer code a predetermined number of times to generate at least a first set of repeated bits and a second set of repeated bits;
   serializing the generated sets of repeated bits, wherein each generated set is serialized in parallel with another generated set;
   interleaving the generated sets of repeated bits resulting in interleaved sets;
   generating an inner code, the inner code generated in part based on the interleaved sets;
   puncturing the inner code to output parity bits, wherein the puncturing is non-uniform and the puncturing is based at least in part on an incremental redundancy scheme; and
   transmitting the parity bits, wherein the transmitted parity bits and the systematic bits comprise the Ir-S-SCP code, wherein puncturing the inner code based at least in part on the incremental redundancy scheme comprises selecting at least one of a repetition profile, a fraction of bits to puncture, and an average number of repetitions per outer code, wherein the repetition profile, the fraction of bits to puncture, and the average number of repetitions per outer code are optimized to be comparable to that of a point design generated Ir-S-SCP code.

2. The method of claim 1, wherein the interleaving is performed by two or more parallel interleavers that receive the generated sets of repeated bits.

3. The method of claim 1, further comprising increasing the fraction of bits to puncture, wherein increasing the fraction of bits to puncture causes an average number of repetitions per outer code output bit to decrease.

4. The method of claim 1, further comprising puncturing the inner code to remove one or more sections near an end of the inner code, wherein the puncturing decreases a length of the inner code.

5. The method of claim 1, wherein the inner code is punctured based on a puncture pattern.

6. The method of claim 5, wherein a fraction of bits to puncture is ⅕, a number of systematic bits is 1024, the first repeated set consists of 2048 bits, and the second repeated set consists of 4096 bits.

7. The method of claim 1, wherein the Ir-S-SCP code is an irregular repeat accumulate code.

8. The method of claim 1, wherein the outer code is generated based on a generator function.

9. The method of claim 8, wherein the generator function is a constant.

10. The method of claim 8, wherein the generator function is (1+D).

11. The method of claim 8, wherein the generator function comprises a constant and (1+D).

12. The method of claim 1, further comprising repeating the plurality of bits twice.

13. A system for transmitting an Irregular Systematic with Serially Concatenated Parity (Ir-S-SCP) code, comprising:
    a generator to generate an outer code comprising a plurality of bits using systematic bits as input;

a repetition unit to repeat the plurality of bits of the outer code a pre-determined number of times to generate at least a first set of repeated bits and a second set of repeated bits;

a plurality of parallel to serial conversion units to serialize generated sets of repeated bits, wherein each generated set of repeated bits is serialized in parallel with another generated set of repeated bits;

an interleaver to interleave the generated sets resulting in interleaved sets;

a code accumulator to generate an inner code, the inner code generated in part based on the interleaved sets;

a puncturer to puncture the inner code to output parity bits, wherein the puncturing is non-uniform and the puncturing is based at least in part on an incremental redundancy scheme; and a transmitter to transmit the parity bits, wherein the transmitted parity bits and the systematic bits comprise the Ir-S-SCP code, wherein puncturing the inner code based at least in part on the incremental redundancy scheme comprises selecting at least one of a repetition profile, a fraction of bits to puncture, and an average number of repetitions per outer code, wherein the repetition profile, the fraction of bits to puncture, and the average number of repetitions per outer code are optimized to be comparable to that of a point design generated Ir-S-SCP code.

14. The system of claim 13, wherein the interleaver is composed of two or more parallel interleavers that receive the generated sets of repeated bits.

15. The system of claim 13, the puncturer configured to increase the fraction of bits to puncture, wherein increasing the fraction of bits to puncture causes an average number of repetitions per outer code output bit to decrease.

16. The system of claim 13, the puncturer further configured to puncture the inner code to remove one or more sections near the end of the inner code, wherein the puncturing decreases a length of the inner code.

17. The system of claim 13, wherein the inner code is punctured based on a puncture pattern.

18. The system of claim 17, wherein a fraction of bits to puncture is $1/5$, a number of systematic bits is 1024, the first repeated set consists of 2048 bits, and the second repeated set consists of 4096 bits.

19. The system of claim 13, wherein the Ir-S-SCP code is an irregular repeat accumulate code.

20. The system of claim 13, wherein the outer code is generated based on a generator function.

21. The system of claim 20, wherein the generator function is a constant.

22. The system of claim 20, wherein the generator function is $(1+D)$.

23. The system of claim 20, wherein the generator function comprises a constant and $(1+D)$.

24. The system of claim 13, further comprising a receiver to receive the transmitted Ir-S-SCP code.

25. The system of claim 24, further comprising a decoder to decode the Ir-S-SCP code.

* * * * *